United States Patent
Hell

(10) Patent No.: US 10,340,864 B2
(45) Date of Patent: *Jul. 2, 2019

(54) TRANSMITTER CIRCUIT AND METHOD FOR CONTROLLING OPERATION THEREOF

(75) Inventor: Magnus-Maria Hell, Munich (DE)

(73) Assignee: Infineon Technologies AG, Neubiberg (DE)

(*) Notice: Subject to any disclaimer, the term of this patent is extended or adjusted under 35 U.S.C. 154(b) by 648 days.

This patent is subject to a terminal disclaimer.

(21) Appl. No.: 13/463,853

(22) Filed: May 4, 2012

(65) Prior Publication Data

US 2013/0294460 A1    Nov. 7, 2013

(51) Int. Cl.
    H04J 3/22     (2006.01)
    H03F 3/24     (2006.01)
    H04L 12/46    (2006.01)
    H04B 3/54     (2006.01)

(52) U.S. Cl.
    CPC .......... *H03F 3/24* (2013.01); *H04L 12/4625* (2013.01); *H04B 3/548* (2013.01); *H04B 2203/547* (2013.01); *H04B 2203/5408* (2013.01)

(58) Field of Classification Search
    CPC . H03F 3/24; H04J 3/22; H04L 12/413; H04L 12/4625; H04L 25/02; H04L 27/00; H04B 3/548; H04B 2203/547; H04B 2203/5408
    See application file for complete search history.

(56) References Cited

U.S. PATENT DOCUMENTS 4,435,824 A * 3/1984 Dellande ............. H04L 27/2014
                                                    375/273
5,267,269 A * 11/1993 Shih .................. H04L 25/03866
                                                    178/69 N
5,291,484 A *  3/1994 Tomita ................. H04B 14/068
                                                    358/438
5,295,132 A *  3/1994 Hashimoto ............. H04L 25/08
                                                    327/63
5,557,221 A    9/1996 Taguchi et al.
(Continued)

FOREIGN PATENT DOCUMENTS

CN          101098108 A      1/2008

OTHER PUBLICATIONS

Hartwich, Florian; "CAN with Flexible Data-Rate"; Mar. 5, 2012; presented at iCC CAN in Automation conference.*

(Continued)

*Primary Examiner* — Jeffrey M Rutkowski
*Assistant Examiner* — Jonathan Wood
(74) *Attorney, Agent, or Firm* — Shumaker & Sieffert, P.A.

(57) ABSTRACT

In various embodiments, a method for controlling the operation of a transmitter circuit is provided, the method including: detecting a state of a message field within a data message to be sent by the transmitter circuit indicating a bit rate to be used for transmission by the transmitter circuit and switching the mode of operation of the transmitter circuit from a first data transmission mode to a second data transmission mode depending on the state of the message indication field, wherein in the first data transmission mode a first circuit configured to transmit data may be used and wherein in the second data transmission mode a second circuit configured to transmit data may be used. Further, a corresponding controlling circuit is provided.

24 Claims, 6 Drawing Sheets

(56) References Cited

U.S. PATENT DOCUMENTS

| | | | | |
|---|---|---|---|---|
| 5,581,707 | A * | 12/1996 | Kuecken | 709/233 |
| 5,652,528 | A * | 7/1997 | Kimura | H03K 19/018507 |
| | | | | 326/83 |
| 5,680,405 | A * | 10/1997 | Pesetski | H04L 1/242 |
| | | | | 714/712 |
| 5,999,389 | A * | 12/1999 | Luebke | H04L 69/40 |
| | | | | 361/67 |
| 6,301,269 | B1 * | 10/2001 | Tayloe | H04Q 11/0478 |
| | | | | 370/399 |
| 6,492,846 | B1 | 12/2002 | Taguchi et al. | |
| 6,611,519 | B1 * | 8/2003 | Howe | H04L 12/5601 |
| | | | | 370/386 |
| 6,631,159 | B1 * | 10/2003 | Morris | H04L 25/0298 |
| | | | | 375/219 |
| 6,693,981 | B1 * | 2/2004 | Yang et al. | 375/340 |
| 6,798,736 | B1 * | 9/2004 | Black et al. | 370/208 |
| 6,907,048 | B1 * | 6/2005 | Treadaway et al. | 370/474 |
| 7,506,390 | B2 | 3/2009 | Dixon et al. | |
| 7,859,299 | B1 * | 12/2010 | Gay | G11C 7/10 |
| | | | | 326/30 |
| 9,257,079 | B2 * | 2/2016 | Zhao | G09G 3/3611 |
| 2003/0042944 | A1 * | 3/2003 | Taguchi et al. | 327/112 |
| 2003/0151945 | A1 * | 8/2003 | Tanzawa | 365/185.01 |
| 2003/0161245 | A1 | 8/2003 | Henrichs | |
| 2003/0167345 | A1 * | 9/2003 | Knight et al. | 709/249 |
| 2004/0173007 | A1 | 9/2004 | McCoy et al. | |
| 2005/0069327 | A1 * | 3/2005 | Franck et al. | 398/141 |
| 2005/0093579 | A1 * | 5/2005 | Yamaguchi | H04L 25/029 |
| | | | | 327/64 |
| 2005/0225971 | A1 | 10/2005 | Melnik | |
| 2006/0262832 | A1 * | 11/2006 | Kaewell, Jr. | 375/141 |
| 2007/0120574 | A1 * | 5/2007 | Houston | H04L 25/0298 |
| | | | | 326/30 |
| 2008/0116992 | A1 * | 5/2008 | Kishigami | H04L 1/24 |
| | | | | 333/101 |
| 2008/0169970 | A1 | 7/2008 | Woodcox et al. | |
| 2008/0211791 | A1 * | 9/2008 | Ryu | G09G 3/3688 |
| | | | | 345/204 |
| 2008/0219711 | A1 | 9/2008 | Bae | |
| 2008/0246511 | A1 * | 10/2008 | Miura | H03F 3/45179 |
| | | | | 326/83 |
| 2009/0073158 | A1 | 3/2009 | Kataoka et al. | |
| 2009/0154365 | A1 * | 6/2009 | Diab et al. | 370/248 |
| 2009/0237264 | A1 | 9/2009 | Bobey et al. | |
| 2009/0244036 | A1 * | 10/2009 | Morita | G09G 3/2096 |
| | | | | 345/204 |
| 2010/0045655 | A1 * | 2/2010 | Jang | 345/213 |
| 2010/0053454 | A1 * | 3/2010 | Sugino | H04N 5/21 |
| | | | | 348/723 |
| 2010/0289521 | A1 * | 11/2010 | Nakata | H04L 25/0278 |
| | | | | 326/30 |
| 2011/0169547 | A1 * | 7/2011 | Suzuki et al. | 327/384 |
| 2011/0196541 | A1 * | 8/2011 | Bauman | G05B 19/0421 |
| | | | | 700/284 |
| 2011/0249686 | A1 * | 10/2011 | Langner et al. | 370/465 |
| 2011/0280322 | A1 * | 11/2011 | Suenaga et al. | 375/257 |
| 2011/0293036 | A1 * | 12/2011 | Ishimaru et al. | 375/295 |
| 2012/0162189 | A1 * | 6/2012 | Ebuchi | H03K 19/00361 |
| | | | | 345/212 |
| 2013/0120186 | A1 * | 5/2013 | Rentala | H03L 7/0812 |
| | | | | 342/194 |
| 2013/0241859 | A1 * | 9/2013 | Saitoh | G06F 3/041 |
| | | | | 345/173 |

OTHER PUBLICATIONS

Robert Bosch GmbH; "CAN FD: CAN with Flexible Data-rate"; Mar. 5, 2012; iCC CAN in Automation conference presentation slides; Bosch Automotive Electronics.*

Robert Bosch GmbH; "CAN with Flexible Data-rate"; Aug. 2011; White Paper Version 1.1; Bosch Automotive Electronics.*

CAN with Flexible Data-Rate, White Paper, Version 1.1, Aug. 2011, Robert Bosch GmbH, obtained from http://www.bosch-semiconductors.de/media/pdf/canliteratur/can_fd.pdf, pp. 1-16.

CRC for CAN with flexible data rate (CAN FD), White Paper, Jan. 11, 2011, Robert Bosch GmbH, obtained from http://www.bosch-semiconductors.de/media/pdf/ipmodules_1/Whitepaper_CRC_CAN_FD_20111128.pdf, pp. 1-4.

Florian Hartwich, CAN with Flexible Data-Rate, Proceedings of the 13th international CAN Conference (iCC), Hambach, Germany, Mar. 5, 2012, pp. 1-9.

Florian Hartwich, CAN with Flexible Data-Rate, Presentation at the 13th international CAN Conference (iCC), Hambach, Germany, Mar. 5, 2012, pp. 1-14.

Philips Semiconductors: "P8xC592 8-bit microcontroller with on-chip CAN", Jun. 27, 1996, 108 pages.

Paret D: "Applications Du Bus CAN", Electronique Radio Plans, SPE, Paris, France, No. 541, Dec. 1992, pp. 63-69.

Robert Bosch GmbH: "CAN with Flexible Data-Rate Specification Version 1.0", Apr. 17, 2012, 34 pages, Germany.

Notice of Allowance received for U.S. Appl. No. 13/463,858 dated Jul. 10, 2015.

Kuanming Wu, CAN 总线原理和应用系统设计, Chinese book, Nov. 30, 1996, total 287 pages, Beihang university press, Beijing.

Bob Greene, Application of Intel's 5V EPROM Family for Microprocessor Systems, Intel, 8 pages.

Unknown, 82527 Serial Communications Controller Architectural Overview, Jan. 1996, Intel.

Unknown, Stand-alone CAN-controller, Nov. 1992, Philips semiconductors.

Chinese book: 邬宽明, "CAN 总线原理和应用系统设计", 北京航空航天大学出版社, Nov. 30, 1996, total 287 pages (for information purpose only).

Communication pursuant to Article 94(3) EPC from European Application No. EP 12170195.7, dated Aug. 4, 2017, 10 pp.

Extended European Search report from counterpart European Application No. 12170202.1, dated Mar. 30, 2015, 7 pp.

Reply to Extended European Search report, dated Mar. 30, 2015, from counterpart European Application No. 12170202.1, filed on Jun. 26, 2015, 4 pp.

Intention to Grant from counterpart European Application No. 12170202.1, dated Jul. 6, 2016, 104 pp.

* cited by examiner

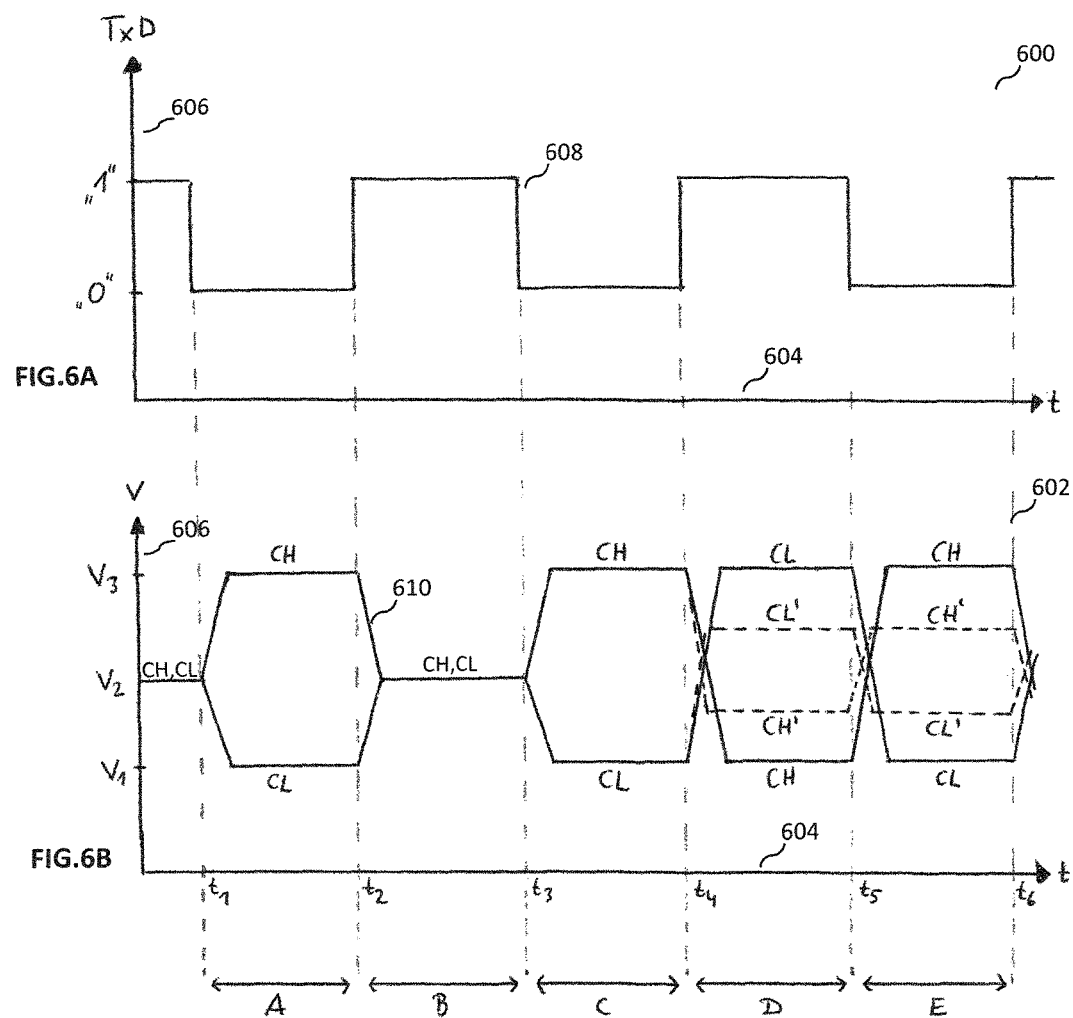

US 10,340,864 B2

TRANSMITTER CIRCUIT AND METHOD FOR CONTROLLING OPERATION THEREOF

TECHNICAL FIELD

In various embodiments a transmitter circuit and a method for controlling the operation of the transmitter circuit with a first data transmission mode and a second data transmission mode is provided.

BACKGROUND

CAN (Controller Area Network) bus has been developed for a wide variety of distributed industrial systems with automotive applications being probably the most prominent field of application. CAN is a multi master architecture which means that each entity connected to the bus (also referred to as a node) is able to send and receive messages, but not at the same time. This is achieved by providing each message with an identifier which also defines the priority of the corresponding message. In order to avoid collisions of messages sent at the same time by different nodes, an arbitration phase precedes each phase during which "payload" data is sent. During the arbitration phase the node with a message of the highest priority is designated to transmit its message whereas all the other nodes enter a listening mode. One aspect limiting the data rate originates from the arbitration phase. During that phase the cycle length of the data rate has to be larger than the time it takes for the signal to travel back and forth from a respective node to a node lying farthest away within the network. In other words, the length of the lines within the network is one factor limiting the data rate.

Further factors limiting the data rate are signal integrity and capacitive loads which affect signal propagation during the arbitration phase, as well as the propagation delay of signals on the conductors. In order to circumvent those limiting factors, CAN FD (CAN with flexible data rate) has been conceived. CAN FD allows for sending data with a slower rate during the arbitration phase, after which the data rate may be increased.

However, the use of common CAN transceivers introduces the following problem. Depending on the network quality, ringing, i.e. an unwanted oscillation of a voltage or current, with typical ringing times on the order of many hundreds of nanoseconds occurs at every switching between a dominant bit and a recessive bit, wherein the dominant bit corresponds to a state of the differential lines carrying substantially different voltages and is interpreted as a logical 0 and the recessive bit corresponds to a state of the differential lines carrying substantially the same voltages and is interpreted as a logical 1. The reason for the ringing can be seen in that the CAN transceivers are basically binary switches, which are either switched on (during the transmission of a dominant bit) or switched off (during the transmission of a recessive bit). The ringing caused by the transition from a dominant state to a recessive state disturbs the actual signal on the bus and impedes a fast and accurate detection of the state of the bus (i.e. a determination whether a dominant bit or a recessive bit is present on the data bus) in a potential receiving node. This effect may also limit the maximally possible data rate. In order to allow a proper communication within the CAN network, those issues are taken into account when the maximal data rate using ordinary CAN transceivers is set. The maximal data rate is so to speak adapted to the integrity of the signals which in practice results in its appropriate limitation.

SUMMARY

In accordance with various embodiments a method for controlling the operation mode of a transmitter circuit, the method comprising: detecting a state of a message field within a data message to be sent by the transmitter circuit indicating a bit rate to be used for transmission by the transmitter circuit and switching the mode of operation of the transmitter circuit from a first data transmission mode to a second data transmission mode depending on the state of the bit rate indication field, wherein in the first data transmission mode a first circuit configured to transmit data is used, the first circuit being configured to provide a first transmission value by a potential between a first conductor and a second conductor determined by a terminating resistor, and a second transmission value by applying a first reference potential to the first conductor and a second reference potential, which is different from the first reference potential, to the second conductor, and wherein in the second data transmission mode a second circuit configured to transmit data is used, the second circuit being configured to provide a first transmission value by applying a third reference potential to the first conductor and a fourth reference potential to the second conductor, and a second transmission value by applying the fourth reference potential to the first conductor and the third reference potential to the second conductor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 6A and 6B show exemplary signal sequences in the transmitter circuit according to various embodiments;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the transmitter circuit according to various embodiments, the mode of operation may be switched from a first data transmission mode to a second data transmission mode. In the second data transmission mode, a full bridge operation mode instead of an open drain operation mode (which is used in the first data transmission mode) is used to alter the potential difference between two signal lines. In the open drain mode only one transistor is used between a well defined potential and a signal line such that one state corresponds to the potential being applied to the signal line through the conducing switch, e.g. a transistor, and the other state corresponds to the signal line being disconnected from the potential by the non-conducting switch, e.g. a transistor. As will be described in more detail later on, by using four switches, for example transistors, in the full bridge mode, the dominant bit and a recessive bit may be defined by potentials applied to both signal lines, which may significantly reduce ringing, i.e. reduce disturbing effects on the signal lines. Thus, the recessive bit may be distinguished from the dominant bit (and vice versa) in an accurate and fast manner thereby enabling a faster data rate in the second data transmission mode. In the second data transmission mode, the logical 0 corresponds to a state which may be also referred to as data0 and the logical 1 corresponds to a state which may be also referred to as data1.

It is to be noted that, although the following implementations are described in the context of a CAN network, any type of other wireline communication network may be provided in alternative implementations of the network 100, e.g. a wireline network using differential potential signalling technologies, e.g. a wireline network supporting a so-called CSMA/CD (Carrier Sense Multiple Access/Collision Detection) communication protocol.

Figure 1:
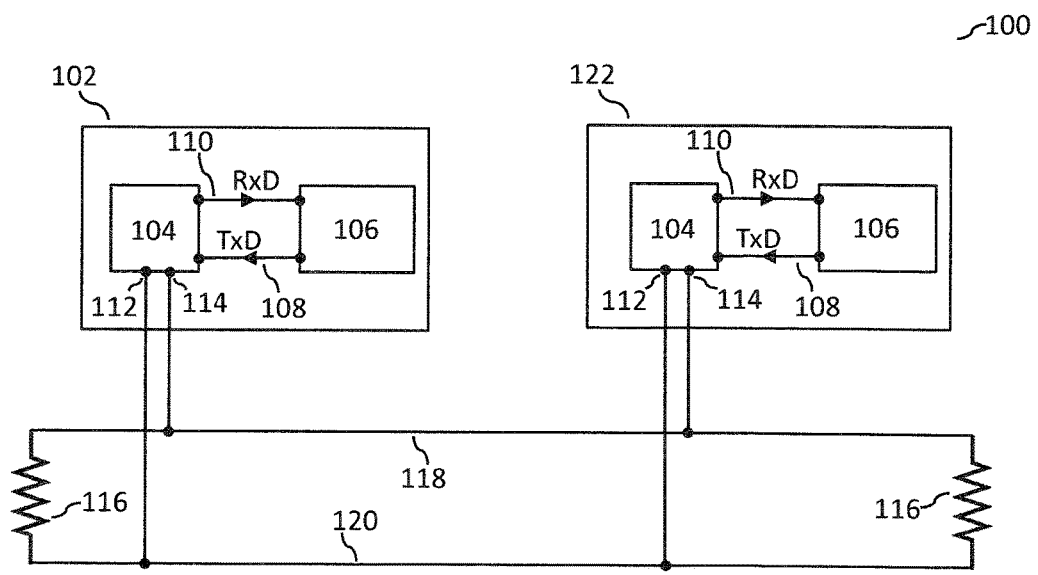
FIG. 1 shows an exemplary CAN network.

In FIG. 1 an exemplary setup of a network 100, which may be a CAN (Controller Area Network) network, is shown. A data bus, which may be configured as a CAN bus, includes a first signal line 118 and a second signal line 120 which may form a differential pair (e.g. a twisted pair), i.e. a pair of conductors used for differential signalling. The first signal line 118 may be the CAN_H line and the second signal line 120 may be the CAN_L line, this choice, however, is arbitrary. CAN_L and CAN_H may correspond to the official CAN bus architecture terminology used for the two signal lines, wherein the CAN_L line may be the line with the lower potential and the CAN_H line may be the line with the higher potential when the state of a dominant bit, i.e. a logical 0, is signalled. At each end of the signal lines a terminating resistor 116 may be provided. The terminating resistors 116 may have a resistance value that is matched to the impedance of the data bus, i.e. the first signal line 118 and the second signal line 120 as a differential pair, in order to avoid reflections. According to ISO-11898, the CAN bus has a nominal characteristic line impedance of 120 Ω.

Several nodes, for example CAN nodes, may be connected to the data bus, for example a first node 102 and a second node 122. A node may be any (electronic) device connected to the data bus, such as a sensor device, an actuator device or an interface device. All the nodes 102, 122 connected to the bus 118, 120 may communicate with one another. Since the structure of the first node 102 and the second node 122 may have a similar structure with respect to their communication capabilities and configurations, only the first node 102 will be described in more detail below. It goes without saying that a larger number of nodes may be connected to the data bus.

The first node 102 (and/or the second node 122) may include a transceiver 104, which may be a CAN transceiver, and a controller 106, which may be a CAN controller. The controller 106 may be configured to translate or transform data streams from within the first node 102 into data streams which may be transmitted via the data bus and to translate or transform data streams received via the data bus into data streams which may be used within the first node 102. The controller 106 may be a CAN controller and may be configured to translate CAN compliant data streams, e.g. CAN messages, into data streams which may be used within the first node 102 and vice versa.

The transceiver 104 may be configured to send and receive data to and from the data bus. In other words, the transceiver 104 may function as a sending and receiving unit between the data bus as a communication bus and the controller 106. The transceiver 104 may be a CAN transceiver and may be configured to send and receive CAN compliant data streams, i.e. CAN messages.

The transceiver may include a first terminal 114 and a second terminal 112, wherein the first terminal 114 is coupled to the first signal line 118 and the second terminal 112 is coupled to the second signal line 120. The transceiver may be configured to alter the voltage applied to the data bus and also to sense the potential difference between the first signal line 118 and the second signal line 120.

The transceiver 104 is communicatively connected to the controller 106 via a first line 110 which may be configured as an reception line (seen from the point of view of the controller 106 with respect to the data bus) and a second line 108 which may be configured as a transmission line (seen from the point of view of the controller 106 with respect to the data bus). The first line 110 may be configured to provide the controller 106 with received data RxD or forward data RxD received by a receiver circuit (not shown in FIG. 1) of the transceiver 104 from the data bus. The second line 108 may be configured to provide the transceiver 104 with data to be transmitted TxD from the controller 106, i.e. data to be transmitted TxD which is outbound and is to be sent or broadcast via the data bus to other nodes. Upon reception of the data to be transmitted TxD from the controller 106, the transmitter circuit (not shown in FIG. 1) of the transceiver 104 applies voltage potentials to the data bus in accordance therewith. For example, in accordance with the CAN standard, in a first case a first reference potential, e.g. a supply potential, may be applied to the first signal line 118 via the first terminal 114 and a second reference potential, e.g. a ground potential, may be applied to the second signal line 120 via the second terminal 112 when a logical 0 is to be transmitted. In a second case, no voltage potentials may be applied to the first and second signal lines when a logical 1 is to be transmitted, i.e. in the latter case the first signal line 118 and the second signal line 120 may have floating potentials, which are substantially equal but which may be subject to disturbances caused by EMI (electromagnetic interference) and thereby be different. Depending on the magnitude of the disturbances, a fast and reliable determination of the voltage between the first signal line 118 and the second signal line 120 may not be possible. It is to be pointed out that the first node 102 and the second node 122 may include various other components specific to the function of the node itself, such as sensing circuits, displaying circuits, displaying arrangements, motors etc., which are omitted from the detailed description.

In general, a CAN (Controller Area Network) may be seen as a multi master architecture which means that each entity connected to the bus (also referred to as a node) is able to send and receive messages, but not at the same time. This is achieved by providing each message to be sent with an identifier which also defines the priority of the corresponding message. In order to avoid collisions of messages sent at the same time by different nodes, an arbitration phase precedes each phase during which "payload" data is sent. During the arbitration phase the node with a message of the highest priority is designated to transmit its message whereas all the other nodes enter a listening mode. In a CAN FD (CAN with flexible data rate) the data rate for transmitting data after completion of the arbitration phase may be increased.

Figure 2:
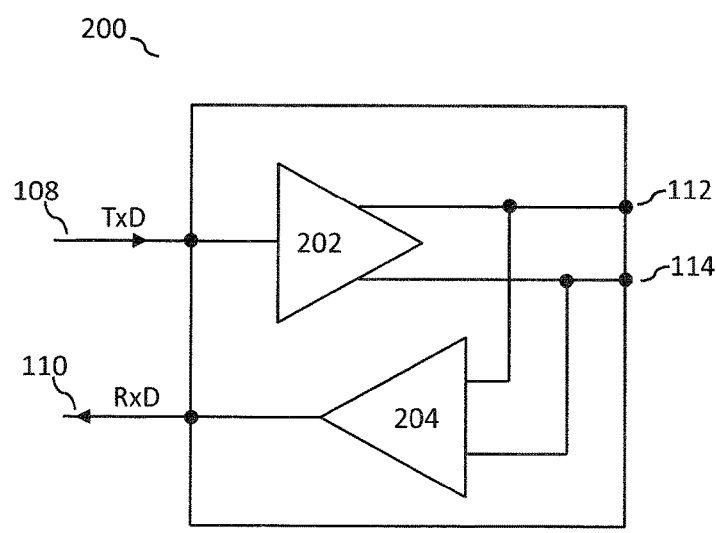
FIG. 2 shows an exemplary CAN transceiver.

A more detailed description of the transceiver 104 is presented in FIG. 2. The transceiver 200 may include the receiver circuit 204 and the transmitter circuit 202. The receiver circuit 204 is coupled to the first terminal 114 and to the second terminal 112 of the first node 102 and may be configured as a differential amplifier or a comparator in order to convert the sensed differential voltage between the first signal line 118 and the second signal line 120 (data bus) into a data stream. This data stream may be provided to the controller 106 in the form of the received data RxD via the first line 110. The transmitter circuit 202 may include a data input which is connected to a data output of the controller 106 via the second line 108 such that data to be transmitted TxD from the controller 106 may be communicated or transmitted to the transmitter circuit 202 through the second line 108. The transmitter circuit 202 may be seen to perform the inverse operation of the receiver circuit 204, i.e. it may be configured to convert data received from the controller 106 into corresponding voltage differences which are applied between the first signal line 118 and the second signal line 120.

The transmitter circuit 202 and the receiver circuit 204 may be configured as CAN compliant devices. In that case, in accordance with ISO 11898, a state in which the voltage difference between the second signal line 120, for example the CAN_L line, and the first signal line 118, for example the CAN_H line, should be in the range from about 1.5 V to about 3 V may be interpreted by both circuits as the dominant state or the dominant bit, i.e. a logical 0. A state in which the voltage difference between the second signal line 120, for example the CAN_L line, and the first signal line 118, for example the CAN_H line, is smaller than 1.5 V, e.g. in the range from about −500 mV to about +50 mV may be interpreted by both circuits as the recessive state or the recessive bit, i.e. a logical 1.

Figure 3:
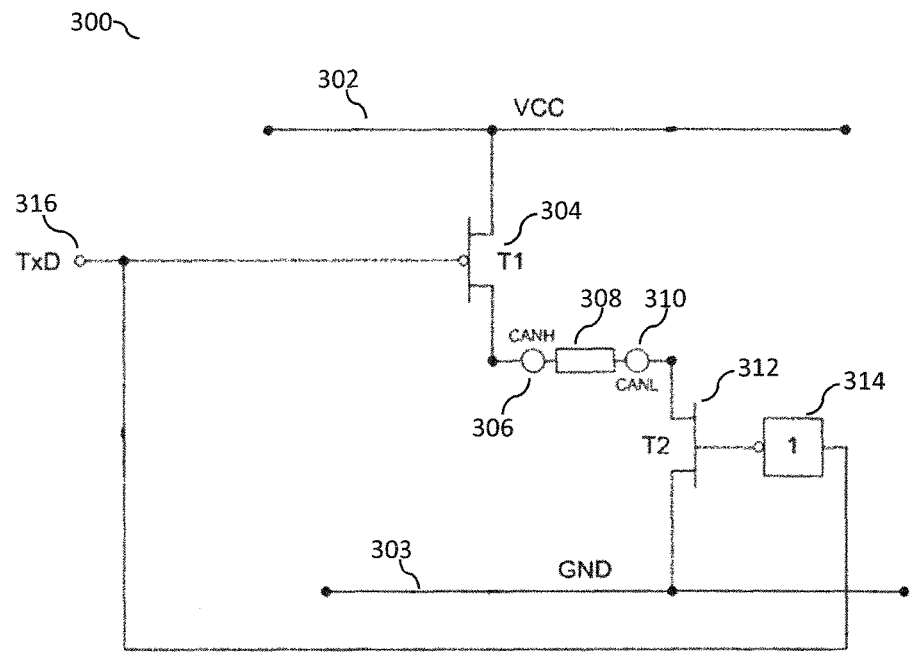
FIG. 3 shows an exemplary CAN transmitter.

In FIG. 3 a more detailed description of the transmitter circuit 202 is presented which is included in the transceiver 200 shown in FIG. 2. The transmitter circuit 300 may include an input 316 at which data to be transmitted TxD (will be referred to as data TxD in the following) from the controller 106 may be provided via the second line 108. The data TxD is applied to a control terminal of a first switch 304 and to an inverter 314 which is coupled to the control terminal of a second switch 312. The inverter 314 in FIG. 3 does not necessarily have to be implemented as a simple NOT-gate in the form of a PMOS-inverter, NMOS-inverter or a CMOS-inverter. The inverter 314 may be a more complex driving circuit which is configured to provide an inverting functionality for the driving signal of the second switch 314 such that the first switch 304 and the second switch 314 are both turned on and off synchronously (e.g. featuring the same voltage curves), taking into consideration the possibly different nature of the first switch 304, which as shown in the exemplary transmitter circuit 300 according to various embodiments of FIG. 3 may be a PMOS transistor, and the second switch 312, which as shown in the exemplary transmitter circuit 300 according to various embodiments FIG. 3 may be an NMOS transistor. The switches may be appropriately configured transistors of any kind, for example MOSFETs (metal-oxide semiconductor field effect transistors) or BJTs (bipolar junction transistors). For example, the first switch 304 may be configured as a PMOSFET (MOSFET with a channel of p-type) and the second switch 312 may be configured as a NMOSFET (MOSFET with a channel of n-type). The first transistor 304 is coupled between a first reference potential 302 (e.g. a power rail having the first reference potential 302) and the first terminal 306 which may correspond to the first terminal 114 in FIG. 1 and hence may be coupled to the first signal line 118. The first reference potential may be 5 V, for example. The second transistor 312 is coupled between a second reference potential 303 (e.g. a power rail having the second reference potential 303) and the second terminal 310 which may correspond to the second terminal 112 in FIG. 1 and hence may be coupled to the second signal line 120. The second reference potential may be the ground potential, for example. The resistor 308 represents the terminating resistors 116 at the ends of the data bus and may have a resistance value of half the resistance value of the terminating resistor 116 and for example, in a CAN compliant network, have a resistance value of approximately 60Ω.

Depending on the value of the bit which is supplied to the transmitter circuit 300 at its input 316, the first transistor 304 and the second transistor 312 are either rendered conducting (i.e. switched on) or non-conducting (i.e. switched off). In case of a CAN compliant transmitter circuit 300, a logical 1 represented by a high value of the signal representing the data TxD signal renders both transistors non-conducting, such that the first reference potential 302 is isolated from or not applied to the first terminal 306 and the second reference potential 303 is isolated from or not applied to the second terminal 310 such that, apart from transient or EMI disturbances the potential difference between the CAN_H line 118 and the CAN_L line 120 is approximately zero. In contrast, a logical 0 represented by a low value of the signal representing the data TxD renders both transistors conducting, such that the first reference potential 302 is applied to the first terminal 306 and the second reference potential 303 is applied to the second terminal 310. In that case the potential difference between the CAN_H line 118 and the CAN_L line 120 assumes a non-zero value which may correspond to the difference between the first reference potential 302 and the second reference potential 303 diminished further by the on-resistances of the transistors and parasitic resistances or in other words to the voltage drop across the resistor 308.

Figure 4:
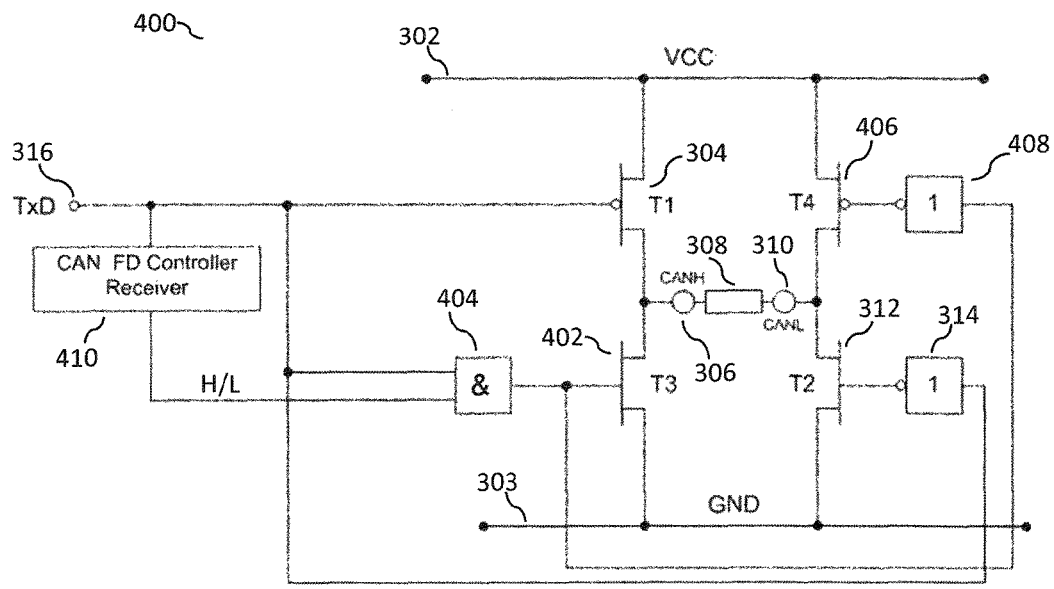
FIG. 4 shows a transmitter circuit according to various embodiments.

A transmitter circuit 400 in accordance with various embodiments is presented in FIG. 4. As the transmitter circuit 400 according to various embodiments is based on the ordinary transmitter circuit 300 shown in FIG. 3, components common to both transmitter circuits are denoted with the same reference numbers and will not be described again.

The transmitter circuit 400 according to various embodiments is based on the transmitter circuit 300 shown in FIG. 3. and may include further components. A third switch 402 is coupled between the second reference potential 303 and the first terminal 306 and a fourth switch 406 is coupled between the first reference potential 302 and the second terminal 310. In analogy to the first and second switches, the third switch 402 and the fourth switch 406 may be appropriately configured transistors of any kind, for example MOSFETs (metal-oxide semiconductor field effect transistors) or BJTs (bipolar junction transistors). For example, the third switch 402 may be configured as an NMOSFET and the fourth switch 406 may be configured as a PMOSFET. The transmitter circuit 400 according to various embodiments further includes a logic AND-gate 404 and a data rate controller 410. The signal representing the data TxD and an output signal H/L from the data rate controller 410 are provided to the logic AND-gate 404. The output of the logic AND-gate 404 is coupled to the control terminal of the third switch 402 and via a further inverter 408 to the control terminal of the fourth switch 406. The transmitter circuit 400 according to various embodiments may further include diodes (not shown in FIG. 4) in order to prevent transient potentials which may build up on either one of the signal lines 118, 120 from disturbing the reference potentials. Those "protective" diodes may be provided or coupled between the first reference potential and the first transistor 304 and the fourth transistor 406, respectively, or between the third transistor 402 and the first terminal 306 and/or the second transistor 312 and the second terminal 310.

The data rate controller 410 is configured to determine whether data TxD is currently to be sent at a standard bit rate or at a preconfigured bit rate which may be faster than the standard bit rate. The data rate controller 410 may be configured to monitor or analyse the data TxD in order to detecting a state of a message field (also referred to as bit rate indication field) within the data TxD to be transmitted. Upon detecting the state of the bit rate indication field within a message (data) frame of the data TxD, the data rate controller 410 may be configured the transmitter circuit 400 to switch from the first data transmission mode into the second data transmission mode by outputting a corresponding output signal H/L to the logic AND-gate 404. The logic AND-gate 404 combines the output signal H/L from the data rate controller 410 with the data TxD currently being sent and outputs a corresponding signal which controls the third switch 402 and the fourth switch 406. In a sense, the data rate controller 410 and the logic AND-gate 404 may be seen to form a switching circuit which is configured to detect the state of a bit rate indication field and switch the data transmission mode of the transmitter circuit 400 according to various embodiments correspondingly, for example from the first data transmission mode into the second data transmission mode, when the bit rate indication field indicates that data TxD is to be sent at the preconfigured bit rate. The bit rate indication field within a frame format of a message containing data TxD (e.g. a CAN FD message) may separate the message into a first part and a second part. A more detailed description of this aspect will be given later on. In a sense the part of a message containing data TxD which is to be send (i.e. the first part or second part of the message data frame) may indicate whether the transmitter circuit 400 according to various embodiments is to be operated in the first data transmission mode or the second data transmission. However, the mode of operation of the transmitter circuit 400 according to various embodiments may be in principle independent of the kind of data TxD (e.g. the first part or the second part of the message data frame) which is being sent or processed by the transmitter circuit 400 according to various embodiments.

In various embodiments of the transmitter circuit 400 as shown in FIG. 4, the pair of switches, which are switched on when a dominant bit is to be communicated, i.e. the first transistor 304 and the second transistor 312 (which provide a first current path), may differ from the pair of switches, which are switched on when a recessive bit is to be communicated, i.e. the third transistor 402 and the fourth transistor 406 (which provide a second current path). For example, the first transistor 304 and the second transistor 312 may be configured such that their on-state resistance is larger than the on-state resistance of the third transistor 402 and the fourth transistor 406. As the two transistors providing the first current path and the second current path, respectively, are coupled in series, their contribution to the total resistance of the respective current path is a sum of their individual on-state resistances. The on-state resistance of the two transistors providing the corresponding current path, i.e. the first current path or the second current path, may be the same or may be different. Therefore, in accordance with various embodiments of the transmitter circuit 400, the sum of the on-state resistances of the first transistor 304 and the second transistor 312 may be smaller than the sum of the on-state resistances of the third transistor 402 and the fourth transistor 406. The on-state resistance of the transistors may be adapted by varying various parameters, for example doping concentration of the substrate, channel width and length and/or oxide thickness. In various further embodiments of the transmitter circuit 400, the sum of the on-state resistances of the first transistor 304 and the second transistor 312 may be substantially equal to the sum of the on-state resistances of the third transistor 402 and the fourth transistor 406. The on-state resistances of the two transistors within a given current path, i.e. the first current path and/or the second current path, may be different from one another.

Figure 5A:
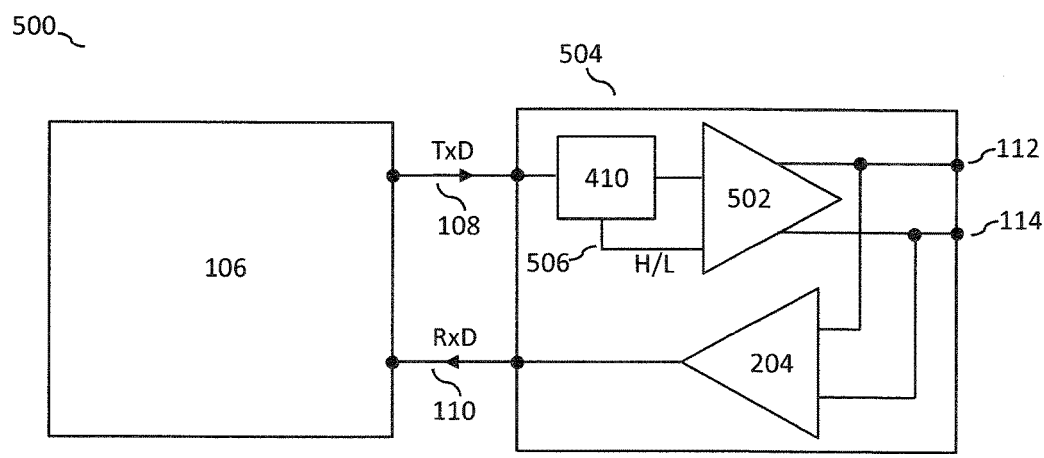
FIGS. 5A and 5B show communication circuits according to various embodiments.
Figure 5B:
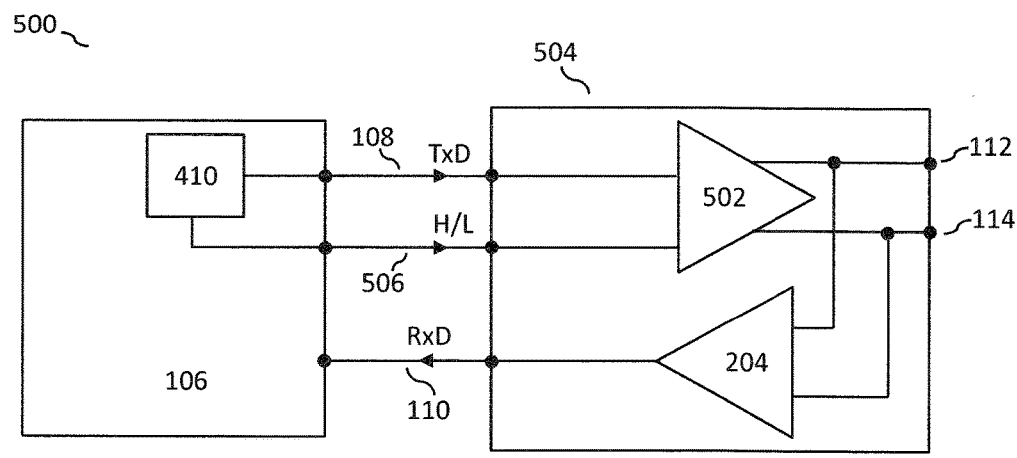

In FIGS. 5A and 5B two different communication circuits according to various embodiments are shown which are illustrated exemplary implementations within the node 102.

In FIG. 5A a communication circuit 500 according to various embodiments within a node 102 as illustrated in FIG. 1 is shown including the controller 106 and the transceiver 504 according to various embodiments. The interior of the transceiver 504 according to various embodiments is shown in more detail. The transceiver 504 according to various embodiments includes the receiver circuit 204, the transmitter circuit 502 according to various embodiments and the data rate controller 410. Although the data rate controller 410 and the transceiver circuit 502 are illustrated as separate entities, they may just as well form one component as shown in FIG. 4, where the data rate controller 410 is part of the transmitter circuit 400 according to various embodiments. The separate display is only for ease of illustration. In any case, the data rate controller 410 is included in the transceiver 504 according to various embodiments as shown in FIG. 5A. Therefore, the controller 106 does not have to be altered, for example no additional terminals have to be provided, since the transceiver 504 according to various embodiments includes the data rate controller 410 and may be able to switch between the first data transmission mode and the second data transmission mode in an autonomous manner. In other words, the transceiver 504 according to various embodiments may not require external inputs in order to decide, whether the transceiver circuit 502 according to various embodiments is to operate in the first or second data transmission mode. As can be seen in FIG. 5A, the signal H/L which may be seen as a data rate indicating signal corresponding to the output signal 506 may be generated on the basis of the data TxD by the data rate controller 410 inside the transceiver 504 according to various embodiments. The data rate indicating signal H/L may be applied to and used within the transmitter circuit 502 according to various embodiments to switch its mode of operation. In other words, the data rate indicating signal H/L may specify, that the transmitter circuit 502 according to various embodiments is to be operated in the first data transmission mode or in the second data transmission mode. In accordance with the data rate indicating signal H/L, the transmitter circuit 502 according to various embodiments may be switched from the first data transmission mode to the data transmission mode. The generation of the data rate indicating signal H/L may be based on the analysis of the data TxD, which includes determining whether the first part of a message data frame or a second part of a message data frame is to be transmitted or processed by the transmitter circuit 502 according to various embodiments.

The communication circuit 500 according to various embodiments shown in FIG. 5B differs from the embodiment thereof shown in FIG. 5A in that the data rate controller 410 is "outsourced" and provided within the controller 106 instead of being provided in the transceiver 504. In this embodiment, an additional communication line needs to be provided in order to transmit the data rate indicating signal H/L from the data rate controller 410 to the transceiver 504. Other than that the functionality of the communication circuit 500 shown in FIG. 5B is the same as the functionality of the communication circuit 500 shown in FIG. 5A.

In the embodiments of the communication circuit 500 shown in FIGS. 5A and 5B the controller 106 may be configured as a CAN controller, for example a CAN microcontroller. The data rate controller 410 may be configured as a CAN FD controller which, among other features, may be configured to detect whether a first part or the second part of a message frame of data TxD and be further configured to indicate to the transmitter circuit 502 according to various embodiments that the second part of the message data frame is to be sent in the second data transmission mode.

In FIGS. 6A and 6B exemplary signal sequences in the transmitter circuit 400 according to various embodiments are shown, for example in the transmitter circuit 400 shown in FIG. 4.

In diagram 600 shown in FIG. 6A a signal 608 representing the data TxD is shown. The x-axis 604 denotes time and the y-axis 606 denotes the amplitude of the signal. Two distinct signal values are marked, wherein the larger value of the signal amplitude denotes a logic 1 and the smaller value denotes a logic 0. Taking this into account, it can be seen that the data TxD presented in diagram 600 of FIG. 6A alternates between a bit value of 1 and a bit value of 0.

In diagram 602 shown in FIG. 6B a signal 610 is shown which represents the potentials present on the first signal line 118 and the second signal line 120 of the data bus as shown in FIG. 1. The x-axis 604 denotes time and the y-axis 606 denotes the voltage as the amplitude of the signal 610. The time axes 604 in diagram 600 and in diagram 602 are synchronized, i.e. marked times $t_1$, $t_2$, $t_3$, . . . occur at the same time in both diagrams.

In the context of a CAN network the signal 610 in diagram 602 may represent the voltage applied to the CAN_H line 118 and the CAN_L line 120. Voltage levels corresponding to the CAN_H line 118 are denoted by CH whereas voltage levels corresponding to the CAN_L line 120 are denoted by CL.

During the operation of a conventional transmitter circuit 300 as shown in FIG. 3, a recessive bit corresponding to a logical 1 may be communicated by deactivating the first switch 304 and the second switch 312. In such a case there is no current flow through the terminating resistor 308 which may be at a floating potential. In other words, no substantial potential difference between the first terminal 306 and the second terminal 310 is generated, hence the first signal line 118 and the second signal line 120 carry the same second voltage $V_2$, as indicated in diagram 602 of FIG. 6B prior to phase A and during phase B. In other words, CL and CH may be substantially equal prior to phase A and during phase B and for example be equal to a second voltage $V_2$. However, transient effects (not shown) may impose different potentials on the first signal line 118 and the second signal line 120 during those phases, such that a potential difference may build up across the terminating resistor 308 leading to a state in which CL is not equal to CL. Depending on the extent of those transient effects, such as EMI disturbances, a proper and fast distinction between a recessive bit and a dominant bit may be hindered. When a dominant bit is to be communicated by the transmitter circuit 300, the first switch 304 and the second switch 312 are activated, resulting in the first reference potential 302 being applied to the first terminal 306 and thereby to the first signal line 118 and the second reference potential 303 being applied to the second terminal 310 and thereby to the second signal line 120. CL may be equal to a first voltage $V_1$ and CH may be equal to a third voltage $V_3$, as indicated in phase A and C. Especially at a transition from a dominant bit to a recessive bit, for example at time $t_2$, a ringing (not shown) may be present on the signal lines which may last for several hundreds of nanoseconds and may hinder a node on the network which is to receive and interpret the signal in a fast and precise detection of the state of the data bus.

During the operation of the transmitter circuit 400 according to various embodiments a further current path including the third transistor 402 and the fourth transistor 406 in the form of the second current path is used in addition to the first current path including the first transistor 304 and the second transistor 312. The second current path may be used in the second data transmission mode and it may remain inactive in the first data transmission mode due to the lack of a corresponding data rate indicating signal H/L.

The generation of a recessive bit and a dominant bit on the data bus in the first data transmission mode of the transmitter circuit 400 according to various embodiments as shown in FIG. 4 is the same as in the case of the conventional transmitter circuit 300 as shown in FIG. 3 and therefore will not be repeatedly described.

The second data transmission mode may be initiated by the data rate controller 410 which monitors the stream of data to be transmitted TxD and, in dependence of the state of the bit rate indication field, may generate a corresponding data rate indicating signal H/L (or change the value thereof from a value indicating the operation in the first data transmission mode to a value indicating the operation in a second data transmission mode). The data rate indicating signal H/L may be processed by the logic AND-gate 404 and cause switching on (rendering conducting) the second current path which may thereby be involved into the process of signal generation.

In the following it will be assumed that the data rate controller 410 detects during phase C a state of the bit rate indication field within the frame format of the message containing data TxD which indicates that data TxD (e.g. the part of the message following the bit rate indication field in the frame format of the message) is to be sent at the preconfigured data rate by the transmitter circuit 400 according to various embodiments. The bit rate indication field itself indicates, whether the part of the message following the bit rate indication field is to be transmitted at the standard bit rate or at the preconfigured bit rate. In the exemplary scenario shown in FIGS. 6A and 6B, at the end of phase C, i.e. at time $t_4$, the transmitter circuit 400 according to various embodiments is switched into the second data transmission mode.

The communication of a dominant bit by the transmitter circuit 400 in accordance with various embodiments in the second transmission mode may be the same as in the case of a conventional transmitter circuit 300 shown in FIG. 4: the first transistor 304 and the second transistor 312 are switched on or rendered conducting such that the first reference potential 302 is applied to the first terminal 306 and the second reference potential 303 is applied to the second terminal 310. This scenario corresponds to phase E in diagram 602 of FIG. 6B. The potential difference between the first signal line 118 which may carry the voltage CH which may be equal to the third voltage $V_3$ and the second signal line 120 which may carry the voltage CL which may be equal to the first voltage $V_1$ may be essentially equal to the potential difference between the first terminal 306 and the second terminal 310. During that time, the third transistor 402 and the fourth transistor 406 remain inactive or non-conducting.

The process of imposing a recessive state on the data bus in the second data transmission mode differs from that in the first data transmission mode. As demonstrated in phase D of diagram 602 in FIG. 6B, where the data to be transmitted TxD corresponds to a logical 1, a recessive bit is transmitted by the transmitter circuit 400 according to various embodiments by applying the first reference potential 302 to the second terminal 310 and the second reference potential 303 to the first terminal 306. In other words, during the transmission of a recessive bit, the potentials applied to the first signal line 118 and the second signal line 120 may be switched with respect to the transmission of a dominant bit, i.e. the voltage CL may now correspond to the third voltage $V_3$ and the voltage CH may now correspond to the first voltage $V_1$. This may be achieved by switching off the first transistor 304 and the second transistor 312 and switching on the third transistor 402 and the fourth transistor 406. The third transistor 402 and the fourth transistor 406 which provide the second current path are only switched on in the second data transmission mode during the provision of a recessive bit by the transmitter circuit 400 according to various embodiments. The switching on of the third transistor 402 and the fourth transistor 406 in the second data transmission mode may be effectuated by a corresponding signal which is generated by data rate controller 410 upon detection of a corresponding state of a bit rate indication field within the data to be transmitted TxD by the transmitter circuit 400 according to various embodiments. The bit rate indication field may correspond to a dedicated bit, for example, such that a first binary value, for instance 0, indicates that the mode of operation is to remain the same, whereas the other binary value, for instance 1, indicated that the mode of operation is to be switched from the first data transmission mode to the second data transmission mode. The switching of the mode of operation may affect the transmission of the second part of the data message frame of data TxD whereas the first part of the data message frame of data TxD may be left unaffected, as the switching of the mode of operation may occur after the first part of the data message frame of data TxD has been already processed or transmitted by the transmitter circuit 400 according to various embodiments.

In various further embodiments, the transmitter circuit 400 may be configured to apply reference potentials to the first terminal 306 and the second terminal 310 during the second data transmission mode which are different from the first data transmission mode. This is demonstrated in phases D and E of the diagram 602 in FIG. 6B. Upon entering into the second data transmission mode, the transmitter circuit 400 according to various embodiments may be configured to switch the values of the first reference potential and the second reference potential to different values. For example, the first reference potential 302 may be switched to a lower value such that when applied to the first signal line 118, the value of the voltage CH' on the first signal line 118 in the second data transmission mode is smaller than the voltage CH on the first signal line 118 in the first data transmission mode. In a similar manner, the second reference potential 303 may be switched to a higher value such that when applied to the second signal line 120, the value of the voltage CL' on the second signal line 120 in the first data transmission mode is larger than the voltage CL on the second signal line 120 in the first data transmission mode. In the first data transmission mode, the first reference potential 302 may be 5V and the second reference potential 303 may be 0V.

Figure 7:
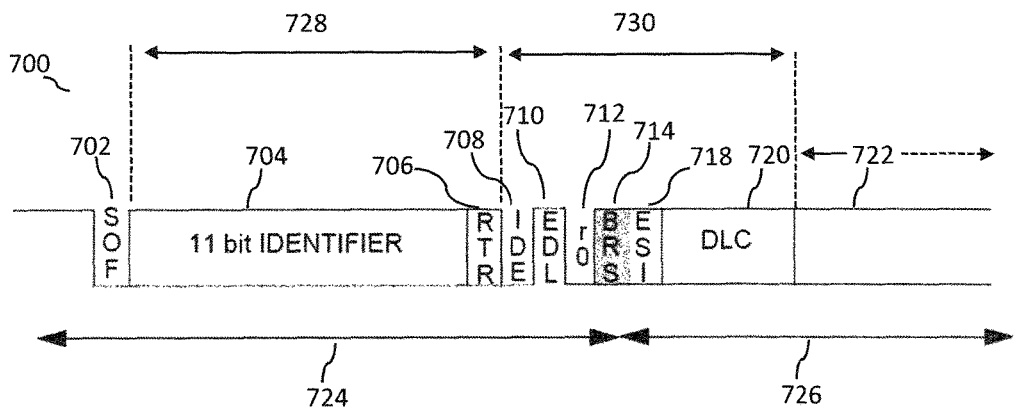
FIG. 7A shows the CAN FD frame format.

As already mentioned, the data rate controller 410 is responsible for detecting the state of the bit rate indication field, e.g. its bit value, within the frame format of the message containing data to be transmitted TxD by the transmitter circuit 400 according to various embodiments. In the CAN architecture, data to be transmitted TxD is transmitted via CAN messages which have a specified data frame format. In FIG. 7 the standard format of a CAN FD message 700 is shown, i.e. a CAN message which may be transmitted at a flexible data rate.

In general, CAN FD messages are based on CAN messages. The CAN FD message 700 starts with an SOF (start of frame) field 702 which is a single dominant bit synchronising all devices connected to the data bus. After the SOF field 702 follows the arbitration field 728 including a message identifier field 704 an RTR (remote transmission) field 706. The arbitration field 728 is used to establish message priority and identification. The arbitration field 728 is followed by a control field 730 containing an IDE (identifier extension) field 708, an EDL (extended data length) field 710, an r0 (reserved bit) field 712, a BRS (bit rate switch) field 714, an ESI (error state indicator) field 718 and a DLC (data length code) field 720. The control field 730 is followed by a data field 722 which contains the actual data.

The BRS field 714 is specific to CAN FD messages. The BRS field 714 decides whether the bit rate is switched inside the date frame to be transmitted or not. According to the CAN FD protocol, if the BRS bit is recessive, the bit rate is switched from the standard bit rate to a preconfigured bit rate, if the BRS bit dominant, the bit rate for the ensuing transmission is not switched. The standard bit rate may be used to transmit data fields up to the BRS field 714. The standard bit rate may be used during the arbitration phase and thus be limited by CAN network parameters, such as the extent of the network and/or parasitic line capacitances. The preconfigured bit rate which may be used to transmit data fields following the BRS field 714 and may be faster than the standard bit rate, as the arbitration phase is finished at that stage. The preconfigured bit rate, if used at all, may be switched back automatically to the standard bit rate when a CRC (cyclic redundancy check) field (not shown in FIG. 7) is reached which follows the data field 722. The data rate controller 410 may be configured to detect a message integrity field, e.g. the CRC field, and alter the data rate signal H/L (e.g. change its bit value to the opposite value with respect to the value indicating the operation in the second data transmission mode) appropriately to cause the transmitter circuit 400 according to various embodiments to switch from the second data transmission mode to the first data transmission mode. The part of the CAN FD message structure 700 covered by the first arrow 724 corresponds to data fields which may be transmitted at the standard bit rate, whereas the part of the CAN FD message structure 700 covered by the second arrow 726 corresponds to data fields which may be transmitted at the standard bit rate or, alternatively, at the preconfigured data rate—depending on the value of the bit rate indication field, e.g. the bit value of the BRS field 714 within the CAN FD message 700.

Figure 8:
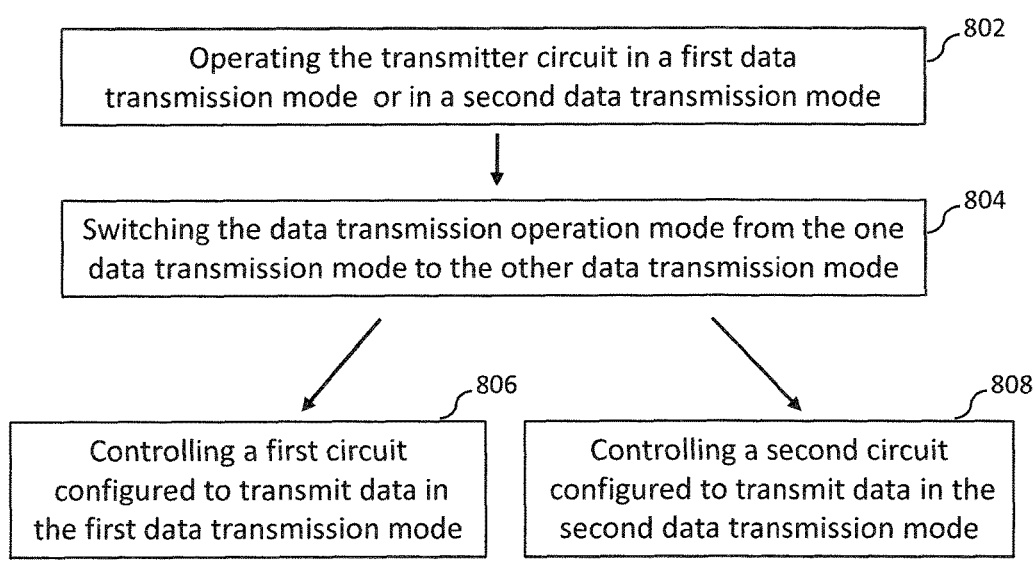
FIG. 8 shows a flow diagram illustrating a method for operating the transmitter circuit according to various embodiments.

In FIG. 8 a flow 800 diagram depicting a method for operating the transmitter circuit according to various embodiments is shown. In step 802 the method 800 may include operating the transmitter circuit according to various embodiments either in the first data transmission mode or in the second data transmission mode. In step 804 the method may include switching the data transmission operation mode from the one data transmission mode to the other data transmission mode. A previously described, the data transmission mode may be switched from the first data transmission mode to the second data transmission mode when the bit rate indication field within the data to be transmitted TxD, for example the BRS field within the CAN FD frame format, has the proper value. Correspondingly, the data transmission mode may be switched from the second data transmission mode to the first data transmission mode when the CRC field within the CAN FD message being processed or transmitted is detected. Operating the transmitter circuit according to various embodiments in the first data transmission mode in step 806 may include controlling the first circuit configured to transmit data to provide the first transmission value by a potential between the first conductor and the second conductor determined by a terminating resistor, and to provide the second transmission value by applying the first reference potential to the first conductor and the second reference potential, which is different from the first reference potential, to the second conductor. Operating the transmitter circuit according to various embodiments in the second data transmission mode in step 808 may include controlling the second circuit configured to transmit data to provide the first transmission value by applying the third reference potential to the first conductor and the fourth reference potential to the second conductor, and to provide a second transmission value by applying the fourth reference potential to the first conductor and the third reference potential to the second conductor.

The standard data rate at which the first part of the CAN FD message may be sent by the transmitter circuit 400 according to various embodiments may be approximately 1 megabit per second, for example. The preconfigured data rate at which the second part of the CAN FD message may be sent by the transmitter circuit 400 according to various embodiments may be several megabit per second, for example approximately 4 megabit per second.

Figure 9:
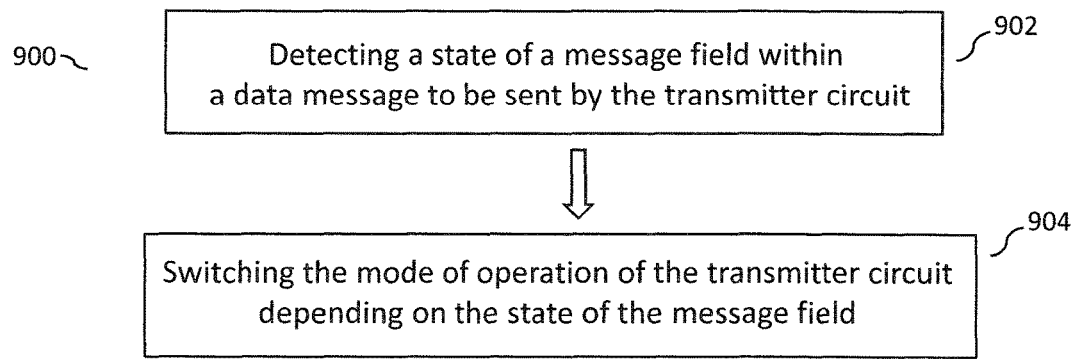
FIG. 9 shows a flow diagram illustrating a method for controlling the operation mode of the transmitter circuit according to various embodiments.

In FIG. 9 a flow diagram 900 depicting method for controlling the operation mode of the transmitter circuit according to various embodiments. In a first step 902 the method may include detecting the state of the message field within a data message to be sent by the transmitter circuit according to various embodiments. As already explained, the message field (bit rate indication field) may be the BRS filed within the frame format of a CAN FD message and, depending whether it is a dominant bit or a recessive bit, may indicate that the transmitter circuit according to various embodiments is to send data at the standard bit rate or at the preconfigured bit rate, respectively. The transmitter circuit according to various embodiments may be configured to transmit the first part of the message data frame in the first data transmission mode and the second part of a message data frame in the second data transmission mode. In other words, the data transmission mode of the transmitter circuit 400 according to various embodiments may be defined or indicated by the part of the message data frame which is currently being transmitted. If data fields of the CAN FD message indicated by the first arrow 724 in FIG. 7 which are preceding the bit rate indication field, e.g. the BRS field 714, are transmitted, the transmitter circuit 400 may be operated or operate in the first data transmission mode. If, on the other hand, data fields of the CAN FD message indicated by the second arrow 726 in FIG. 7 which follow the bit rate indication field, e.g. the BRS field 714, are transmitted, the transmitter circuit 400 may be in the second data transmission mode. The message field, e.g. the BRS field 714, may therefore have a dual functionality: it may separate the message data frame into two parts, a first part preceding the message field and a second part following the message field and it may simultaneously indicate whether the transmitter circuit 400 according to various embodiments is to be operated in the first data transmission mode or the second data transmission mode when sending or transmitting the second part of the CAN FD message (indicated by the second arrow 726 in FIG. 7) containing data TxD. It is to be noted that the data transmission rate may be independent of the data transmission mode in the sense that data TxD which is transmitted in the second data transmission mode, e.g. the second part of the message data frame indicated by the second arrow 726 in FIG. 7, does not necessarily have to be transmitted at the preconfigured data rate but, may be also transmitted at the standard data rate. According to various further embodiments of the transmitter circuit, the message field may correspond to other fields or bits included in the message containing data TxD. For example, the RTR field 706 or the EDL field 710 field within the frame format of a CAN FD message 700 may be used as a trigger to switch the mode of operation of the transmitter circuit 400 according to various embodiments, for example from the first data transmission mode to the second data transmission mode. Also, a different message field than the BRS field 714 within the frame format of a CAN FD message 700 may be interpreted in order to derive information with regard to the data transmission mode and/or the data rate to be used. For example, the value of the RTR field 706 may be detected by the data rate controller and the transmitter circuit according to various embodiments may be switched from the first data transmission mode to the second data transmission mode, if the RTR field 706 bit is a dominant bit and thus the message to be sent is a data frame carrying "payload data" in contrast to a remote data frame which is used by a node to request data from another node and may be indicated by a recessive RTR field 706 bit value.

In step 904, the method may include switching the mode of operation of the transmitter circuit from the first data transmission mode to the second data transmission mode depending on the state of the bit rate indication field. The data rate controller 410 may be configured to read the bit rate indication field, e.g. the BRS field 714, within the CAN FD message 700 which is received at the input 316 of the transmitter circuit 400 according to various embodiments. Depending on the state of the bit rate indication field, e.g. depending on whether the BRS field 714 corresponds to a recessive or a dominant bit, the data rate controller 410 may generate a corresponding output signal H/L (or change the level of the output signal H/L to a corresponding value) which is a precondition for the switching on of the third transistor 402 and the fourth transistor 406 which, when activated, provide the second current path which may only be used during the second data transmission mode. According to various embodiments, the mode of operation of the transmitter circuit may be switched only if the bit rate indication field indicates that the data TxD (e.g. the part of the CAN FD message following the BRS field within the CAN FD message frame format) is to be sent at the preconfigured data rate. However, according to various further embodiments, the mode of operation of the transmitter circuit may be switched from the first data transmission mode to the second data transmission mode even if the bit rate indication field indicates that the data TxD is to be sent at the standard bit rate. In such a case, the transmitter circuit according to various further embodiment may be operated in the second data transmission mode, but nevertheless transmit data at the standard bit rate. In other words, the operation mode of the transmitter circuit according to various embodiments may be independent of the bit rate, i.e. the transmitter circuit 400 according to various embodiments may transmit or send data TxD at the standard bit rate or the preconfigured bit rate, in the second data transmission mode.

Figure 10:
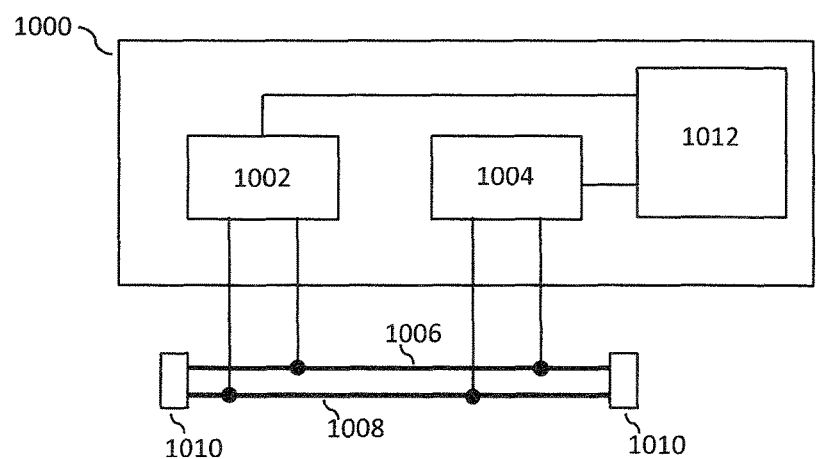
FIG. 10 shows a schematic of a transmitter circuit according to various embodiments.

In FIG. 10 a schematic of a transmitter circuit 1000 according to various embodiments is shown. The transmitter circuit 1000 according to various embodiments may include the first circuit 1002 configured to transmit data in the first data transmission mode, wherein in the first data transmission mode, a first transmission value is provided by a potential between the first conductor 1006 and the second conductor 1008 determined by the terminating resistor 1010, and wherein a second transmission value is provided by applying the first reference potential to the first conductor 1006 and the second reference potential, which is different from the first reference potential, to the second conductor 1008. The transmitter circuit 1000 according to various embodiments may further include the second circuit 1004 configured to transmit data the second data transmission mode, wherein in the second data transmission mode, a first transmission value is provided by applying the third reference potential to the first conductor 1006 and the fourth reference potential to the second conductor 1008, and a second transmission value is provided by applying the fourth reference potential to the first conductor 1006 and the third reference potential to the second conductor 1008. The transmitter circuit 1000 according to various embodiments may further include the switching circuit 1012 configured to control the first circuit 1002 and the second circuit 1004 to transmit data in the first data transmission mode or in the second data transmission mode.

Figure 11:
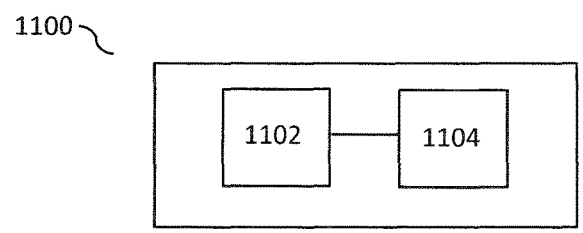
FIG. 11 shows a schematic of a controlling circuit according to various embodiments.

In FIG. 11 a schematic of a controlling circuit 1100 for a transmitter circuit according to various embodiments is shown. The controlling circuit 1100 according to various embodiments may include a detection circuit 1102 configured to detect a state of a bit rate indication field within a data message to be sent by the transmitter circuit and a switching circuit 1104 configured to generate a switching signal for the transmitter circuit depending on a state of the bit rate indication field.

In accordance with various embodiments a method for controlling the operation mode of a transmitter circuit according to various embodiments is provided, the method including: detecting a state of a bit rate indication field within a data message to be sent by the transmitter circuit and switching the mode of operation of the transmitter circuit from a first data transmission mode to a second data transmission mode depending on the state of the bit rate indication field, wherein in the first data transmission mode a first circuit configured to transmit data may be used, the first circuit being configured to provide a first transmission value by a potential between a first conductor and a second conductor determined by a terminating resistor, and a second transmission value by applying a first reference potential to the first conductor and a second reference potential, which is different from the first reference potential, to the second conductor, and wherein in the second data transmission mode a second circuit configured to transmit data may be used, the second circuit being configured to provide a first transmission value by applying a third reference potential to the first conductor and a fourth reference potential to the second conductor, and a second transmission value by applying the fourth reference potential to the first conductor and the third reference potential to the second conductor.

According to various embodiments of the method, the message field may be arranged between a first part and a second part of the data message to be transmitted.

According to various embodiments, the method may include transmitting the first part of the data message to be transmitted in the first data transmission mode independent of the state of the message field.

According to various embodiments, the method may include transmitting the second part of the data message to be transmitted in the first data transmission mode or the second data transmission mode depending on the state of message field.

According to various embodiments of the method, the message field may correspond to a bit rate switch bit indicating a bit rate to be used for transmission by the transmitter circuit, e.g. to the bit rate switch within the frame format of CAN FD messages.

According to various embodiments, the method may include switching from the first data transmission mode to the second data transmission mode upon detection of the message field bit value being equal to the first transmission value.

According to various embodiments, the method may include switching from the second data transmission mode to the first data transmission mode upon detection of the message integrity field within the data message to be transmitted.

According to various embodiments, the method may include controlling a first transistor coupled between the first reference potential and the first conductor and a second transistor coupled between the second reference potential and the second conductor to enter into a non-conducting state, when a the first transmission value is to be transmitted.

According to various embodiments, the method may include controlling the first transistor and the second transistor to enter into a conducting state, when the second transmission value is to be transmitted.

According to various embodiments, the method may include switching the first reference potential to the fourth reference potential and the second reference potential to the third reference potential when first data transmission mode is switched to the second data transmission mode.

According to various embodiments of the method, the first reference potential may be equal to the fourth reference potential and the second reference potential may be equal to the third reference potential.

According to various embodiments, the method may include controlling a third transistor coupled between the third reference potential and the first conductor and a fourth transistor coupled between the fourth reference potential and the second conductor to enter into a conducting state, when the first transmission value is to be transmitted in the second data transmission mode.

According to various embodiments, the method may include controlling the third transistor and the fourth transistor to enter into a non-conducting state, when the second transmission value is to be transmitted in the second data transmission mode.

According to various embodiments, the method may include applying a base potential to the first conductor and to the second conductor.

According to various embodiments of the method, the base potential may be smaller than the larger one of the first reference potential and the second reference potential.

According to various embodiments, the method may further include transmitting data in the second data transmission mode at a higher bit rate than in the first data transmission mode.

According to various embodiments of the method, in the first data transmission mode data may be sent at a bit rate of up to 1 Megabit per second.

According to various embodiments of the method, in the second data transmission mode data may be sent at a bit rate of more than 1 Megabit per second.

In accordance with various embodiments a controlling circuit for a transmitter circuit is provided, the circuit including a detection circuit configured to detect a state of the message field within a data message to be sent by the transmitter circuit and a switching circuit configured to generate a switching signal for the transmitter circuit depending on the state of the message field, wherein the transmitter circuit may include: a first circuit configured to transmit data in a first data transmission mode, wherein in the first data transmission mode, a first transmission value may be provided by a potential between a first conductor and a second conductor determined by a terminating resistor, and wherein a second transmission value may be provided by applying a first reference potential to the first conductor and a second reference potential, which is different from the first reference potential, to the second conductor; a second circuit configured to transmit data in a second data transmission mode, wherein in the second data transmission mode, a first transmission value may be provided by applying a third reference potential to the first conductor and a fourth reference potential to the second conductor, and a second transmission value may be provided by applying the fourth reference potential to the first conductor and the third reference potential to the second conductor.

According to various embodiments of the controlling circuit, the message field may correspond to a bit rate switch bit indicating a bit rate to be used for transmission by the transmitter circuit, for example to the bit rate switch bit within the frame format of CAN FD messages.

According to various embodiments of the controlling circuit, the detection circuit may be further configured to generate a backswitching signal for the transmitter circuit upon detection of a cyclic redundancy check field within the data message to be sent by the transmitter circuit.

According to various embodiments of the controlling circuit, the switching circuit may be configured to generate the switching signal for the transmitter circuit by setting an output level of its output signal provided to the transmitter circuit to a first value indicating that the transmitter circuit is to be switched from a first operation mode to a second operation mode.

According to various embodiments of the controlling circuit, the switching circuit may be further configured to generate the backswitching signal for the transmitter circuit by setting the output level of its output signal provided to the transmitter circuit to a second value which is different from the first value and may indicate that the transmitter circuit is to be switched from the second operation mode to the first operation mode.

In accordance with various embodiments a transmitter circuit is provided, which includes: a first circuit configured to transmit data in a first data transmission mode, wherein in the first data transmission mode, a first transmission value may be provided by a potential between a first conductor and a second conductor determined by a terminating resistor, and wherein a second transmission value may be provided by applying a first reference potential to the first conductor and a second reference potential, which is different from the first reference potential, to the second conductor; a second circuit configured to transmit data in a second data transmission mode, wherein in the second data transmission mode, a first transmission value may be provided applying a third reference potential to the first conductor and a fourth reference potential to the second conductor, and a second transmission value may be provided applying the fourth reference potential to the first conductor and the third reference potential to the second conductor; and a switching circuit configured to control the first circuit and the second circuit to transmit data in the first data transmission mode or in the second data transmission mode.

According to further embodiments of the transmitter circuit, the first circuit may include a first transistor coupled between the first reference potential and the first conductor.

According to further embodiments of the transmitter circuit, the first circuit may include a second transistor coupled between the second reference potential and the second conductor.

According to further embodiments of the transmitter circuit, in the first data transmission mode the first transistor and the second transistor may be in a non-conducting state, when the first transmission value is to be transmitted.

According to further embodiments of the transmitter circuit, in the first data transmission mode the first transistor and the second transistor may be in a conducting state, when the second transmission value is to be transmitted.

According to further embodiments of the transmitter circuit, the first transistor and the second transistor may be configured to be rendered into the same state with regard to conductivity by the same driving signal.

According to further embodiments of the transmitter circuit, the first transistor and the second transistor may be configured to or may be controlled to be rendered into opposite states with regard to conductivity by the same driving signal.

According to further embodiments of the transmitter circuit, in the first data transmission mode the potential difference between the first conductor and the second conductor for the provision of the first transmission value may be smaller than the potential difference between the first conductor and the second conductor for the provision of the second transmission value.

According to further embodiments of the transmitter circuit, the second circuit may include a third transistor which is coupled between the third reference potential and the first conductor.

According to further embodiments of the transmitter circuit, the second circuit may include a fourth transistor which is coupled between the fourth reference potential and the second conductor.

According to further embodiments of the transmitter circuit, in the second data transmission mode the third transistor and the fourth transistor may be configured to be in a conducting state, when the first transmission value is to be transmitted.

According to further embodiments of the transmitter circuit, in the second data transmission mode the first transistor and the second transistor may be configured to be in a conducting state, when the second transmission value is to be transmitted.

According to further embodiments of the transmitter circuit, the second circuit may include the first circuit.

According to further embodiments of the transmitter circuit, the third transistor and the fourth transistor may be configured to be in a non-conducting state during the first data transmission mode.

According to further embodiments of the transmitter circuit, during the second data transmission mode the first transistor may be coupled to the fourth reference potential instead of being coupled to the first reference potential.

According to further embodiments of the transmitter circuit, during the second data transmission mode the second transistor may be coupled to the third reference potential instead of being coupled to the second reference potential.

According to further embodiments of the transmitter circuit, the value of the first reference potential may be substantially equal to the value of the fourth reference potential.

According to further embodiments of the transmitter circuit, the value of the second reference potential may be substantially equal to the value of the third reference potential.

According to further embodiments of the transmitter circuit, the third transistor and the fourth transistor may be configured to be rendered into the same state with regard to conductivity by the same driving signal.

According to further embodiments of the transmitter circuit, the third transistor and the fourth transistor may be configured to be rendered into opposite states with regard to conductivity by the same driving signal.

According to further embodiments of the transmitter circuit, in the second data transmission mode the potential difference between the first conductor and the second conductor for the provision of the first transmission value and the potential difference between the first conductor and the second conductor for the provision of the second transmission value may have the same magnitude but opposite polarities.

According to further embodiments of the transmitter circuit, in the second data transmission mode the potential difference between the first conductor and the second conductor for the provision of the first transmission value may have a smaller magnitude and the opposite polarity with respect to the potential difference between the first conductor and the second conductor for the provision of the second transmission value.

In accordance with various embodiments a transmitter circuit is provided, including: a first circuit configured to transmit data in a first data transmission mode, wherein in the first data transmission mode, a first transmission value may be provided by a applying a base potential to a first conductor and to a second conductor, and wherein a second transmission value may be provided by applying a first reference potential to the first conductor and a second reference potential, which is different from the first reference potential, to the second conductor; a second circuit configured to transmit data in a second data transmission mode, wherein in the second data transmission mode, a first transmission value may be provided by applying a third reference potential to the first conductor and a fourth reference potential to the second conductor, and a second transmission value may be provided by applying the fourth reference potential to the first conductor and the third reference potential to the second conductor; and a switching circuit configured to control the first circuit and the second circuit to transmit data in the first data transmission mode or in the second data transmission mode.

According to further embodiments of the transmitter circuit, the base potential may be smaller than the larger one of the first reference potential and the second reference potential.

In accordance with various embodiments a method for operating the transmitter circuit according to various embodiments is provided, the method including: operating the transmitter circuit either in a first data transmission mode or in a second data transmission mode; and switching the operation mode of the transmitter circuit from the one data transmission mode to the other data transmission mode; wherein in the first data transmission mode, controlling a first circuit configured to transmit data may include providing a first transmission value by a potential between a first conductor and a second conductor determined by a terminating resistor, and providing a second transmission value by applying a first reference potential to the first conductor and a second reference potential, which is different from the first reference potential, to the second conductor; in the second data transmission mode, controlling a second circuit configured to transmit data may include providing the first transmission value by applying a third reference potential to the first conductor and a fourth reference potential to the second conductor, and providing the second transmission value by applying the fourth reference potential to the first conductor and the third reference potential to the second conductor.

According to further embodiments, the method may additionally include providing the first transmission value in the first transmission mode by rendering a first transistor provided between the first reference potential and the first conductor and a second transistor provided between the second reference potential and the second conductor non-conducting.

According to further embodiments, the method may additionally include providing the second transmission value in the first transmission mode by rendering the first transistor and the second transistor conducting.

According to further embodiments of the method, the first transmission value in the first data transmission mode may be provided by a potential difference between the first conductor and the second conductor which is smaller than a potential difference applied between the first conductor and the second conductor for the provision of the second transmission value.

According to further embodiments of the method, the first transmission value in the second transmission mode may be provided by rendering a third transistor which is coupled between the third reference potential and the first conductor and a fourth transistor which is coupled between the fourth reference potential and the second conductor conducting and rendering the first transistor and the second transistor non-conducting.

According to further embodiments of the method, the second transmission value in the second transmission mode may be provided by rendering the third transistor and the fourth transistor non-conducting and rendering the first transistor and the second transistor According to further embodiments, the method may include providing the third reference potential instead of the first reference potential to the first conductor via the first transistor during the second data transmission mode.

According to further embodiments, the method may include providing the fourth reference potential instead of the first reference potential to the second conductor via the second transistor during the second data transmission mode.

According to further embodiments of the method, the value of the first reference potential may be substantially equal to the value of the third reference potential.

According to further embodiments of the method, the value of the second reference potential may be substantially equal to the value of the fourth reference potential.

According to further embodiments, the method may include, in the second data transmission mode, applying a potential difference between the first conductor and the second conductor for the provision of the first transmission value which has the same magnitude but an opposite polarity as compared to a potential difference applied to the first conductor and the second conductor for the provision of the second transmission value.

According to further embodiments, the method may include, in the second data transmission mode, applying a potential difference between the first conductor and the second conductor for the provision of the first transmission value which has a smaller magnitude and an opposite polarity as compared to a potential difference applied to the first conductor and the second conductor for the provision of the second transmission value.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for controlling the operation mode of a transmitter circuit, the method comprising:

detecting a state of a message field within a data message to be sent by the transmitter circuit indicating a bit rate to be used for transmission by the transmitter circuit;

switching the mode of operation of the transmitter circuit from a first data transmission mode to a second data transmission mode using a switching signal;

wherein a terminating resistor is coupled between a first transmission line and a second transmission line and wherein the first transmission line and the second transmission line form a pair of conductors for differential signaling;

wherein, when the switching signal indicates the switching mode of operation is the first data transmission mode, a first circuit configured to transmit data is used, the first circuit being configured to provide a first transmission value of the differential signaling by applying a potential between a first conductor that is coupled to a first transmission line and a second conductor that is coupled to the second transmission line, wherein the potential is determined by the terminating resistor coupled between the first transmission line and the second transmission line, and a second transmission value of the differential signaling by applying a first reference potential to the first conductor and a second reference potential, which is different from the first reference potential, to the second conductor; and wherein, when the switching signal indicates the switching mode of operation is the second data transmission mode, a second circuit configured to transmit data is used, the second circuit being configured to provide the first transmission value of the differential signaling by applying a third reference potential to the first conductor and a fourth reference potential to the second conductor, and the second transmission value of the differential signaling by applying the fourth reference potential to the first conductor and the third reference potential to the second conductor; wherein a logic gate is configured to output a second output signal to control the second circuit.

2. The method of claim 1, wherein the message field is arranged between a first part and a second part of the data message to be transmitted.

3. The method of claim 2, further comprising: transmitting the first part of the data message to be transmitted in the first data transmission mode independent of the state of the message field.

4. The method of claim 2, further comprising: transmitting the second part of the data message to be transmitted in the first data transmission mode or the second data transmission mode depending on the state of the message field.

5. The method of claim 1, wherein the message field comprises a bit rate switch bit indicating a bit rate to be used for transmission by the transmitter circuit.

6. The method of claim 5, further comprising: switching from the first data transmission mode to the second data transmission mode upon detection of a bit value of the message field being equal to the first transmission value.

7. The method of claim 1, comprising: switching from the second data transmission mode to the first data transmission mode upon detection of a data integrity field within the data message to be transmitted.

8. The method of claim 1, further comprising: controlling a first transistor coupled between the first reference potential and the first conductor and a second transistor coupled between the second reference potential and the second conductor to enter into a non-conducting state, when the first transmission value is to be transmitted in the first data transmission mode.

9. The method of claim 1, further comprising: controlling a first transistor coupled between the first reference potential and the first conductor and a second transistor coupled between the second reference potential and the second conductor to enter into a conducting state, when the second transmission value is to be transmitted in the first data transmission mode.

10. The method of claim 1, switching the first reference potential to the fourth reference potential and the second reference potential to the third reference potential when first data transmission mode is switched to the second data transmission mode.

11. The method of claim 1, wherein the first reference potential is equal to the fourth reference potential and the second reference potential is equal to the third reference potential.

12. The method of claim 1, further comprising: controlling a third transistor coupled between the third reference potential and the first conductor and a fourth transistor coupled between the fourth reference potential and the second conductor to enter into a conducting state, when the first transmission value is to be transmitted in the second data transmission mode.

13. The method of claim 1, further comprising: controlling a third transistor coupled between the third reference potential and the first conductor and a fourth transistor coupled between the fourth reference potential and the second conductor to enter into a non-conducting state, when the second transmission value is to be transmitted in the second data transmission mode.

14. The method of claim 1, further comprising: applying a base potential to the first conductor and to the second conductor.

15. The method of claim 14, wherein the base potential is smaller than the larger one of the first reference potential and the second reference potential.

16. The method of claim 1, further comprising: transmitting data in the second data transmission mode at a higher bit rate than in the first data transmission mode.

17. The method of claim 16, wherein in the first data transmission mode data is sent at a bit rate of up to 1 Megabit per second.

18. The method of claim 1, wherein in the second data transmission mode data is sent at a bit rate of more than 1 Megabit per second.

19. A controlling circuit for a transmitter circuit, the controlling circuit comprising:
a detection circuit configured to detect a state of a message field within a data message to be sent by the transmitter circuit;
a switching circuit configured to generate a switching signal for the transmitter circuit depending on a state of the message field, wherein a terminating resistor is coupled between a first transmission line and a second transmission line and wherein the first transmission line and the second transmission line form a pair of conductors for differential signaling; wherein the transmitter circuit comprises:
a first circuit configured to transmit data in a first data transmission mode when the switching signal indicates the switching mode of operation is the first data transmission mode, wherein in the first data transmission mode, a first transmission value of the differential signaling is provided by applying a potential between a first conductor that is coupled to the first transmission line and a second conductor that is coupled to the second transmission line, wherein the potential determined by the terminating resistor coupled between the first transmission line and the second transmission line, and wherein a second transmission value of the differential signaling is provided by applying a first reference potential to the first conductor and a second reference potential, which is different from the first reference potential, to the second conductor;
a second circuit configured to transmit data in a second data transmission mode when the switching signal indicates the switching mode of operation is the second data transmission mode, wherein in the second data transmission mode, the first transmission value of the differential signaling is provided by applying a third reference potential to the first conductor and a fourth reference potential to the second conductor, and the second transmission value of the differential signaling is provided by applying the fourth reference potential to the first conductor and the third reference potential to the second conductor;
a data rate controller configured to output a first output signal to a logic gate.

20. The controlling circuit of claim 19, wherein the message field corresponds to the bit rate switch bit indicating a bit rate to be used for transmission by the transmitter circuit.

21. The controlling circuit of claim 19, wherein the detection circuit is further configured to generate a back-switching signal for the transmitter circuit upon detection of a data integrity field within the data message to be sent by the transmitter circuit.

22. The controlling circuit of claim 19, wherein the switching circuit is configured to generate the switching signal for the transmitter circuit by setting an output level of its output signal provided to the transmitter circuit to a first value indicating that the transmitter circuit is to be switched from a first operation mode to a second operation mode.

23. The controlling circuit of claim 22, wherein the switching circuit is further configured to generate a back-switching signal for the transmitter circuit by setting the output level of its output signal provided to the transmitter circuit to a second value which is different from the first value and indicates that the transmitter circuit is to be switched from the second operation mode to the first operation mode.

24. The method of claim 19, wherein the logic gate comprises an AND-gate.

* * * * *